United States Patent
Hempel et al.

(10) Patent No.: US 8,735,270 B2
(45) Date of Patent: May 27, 2014

(54) METHOD FOR MAKING HIGH-K METAL GATE ELECTRODE STRUCTURES BY SEPARATE REMOVAL OF PLACEHOLDER MATERIALS

(71) Applicant: GLOBALFOUNDRIES Inc., Grand Cayman (KY)

(72) Inventors: Klaus Hempel, Dresden (DE); Sven Beyer, Dresden (DE); Markus Lenski, Dresden (DE); Stephan Kruegel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/888,753

(22) Filed: May 7, 2013

(65) Prior Publication Data

US 2013/0273729 A1    Oct. 17, 2013

Related U.S. Application Data

(62) Division of application No. 12/894,746, filed on Sep. 30, 2010, now abandoned.

(30) Foreign Application Priority Data

Oct. 30, 2009  (DE) .......................... 10 2009 046 245

(51) Int. Cl.
*H01L 21/3205* (2006.01)
*H01L 21/4763* (2006.01)
*H01L 21/336* (2006.01)
*H01L 21/8238* (2006.01)
*H01L 21/28* (2006.01)

(52) U.S. Cl.
CPC *H01L 21/823842* (2013.01); *H01L 21/823807* (2013.01); *H01L 21/28088* (2013.01); *H01L 21/82385* (2013.01)
USPC ............ 438/592; 438/199; 438/275; 438/585

(58) Field of Classification Search
CPC ................. H01L 29/66545; H01L 21/823842; H01L 21/823807; H01L 21/28088; H01L 21/82385
USPC .......... 438/585, 592, 275, 199; 257/E21.409, 257/E21.444
See application file for complete search history.

(56) References Cited

U.S. PATENT DOCUMENTS

| | | | |
|---|---|---|---|
| 7,745,889 B2 | 6/2010 | Lin et al. | 257/412 |
| 8,039,381 B2 * | 10/2011 | Yeh et al. | 438/595 |
| 2001/0027005 A1 | 10/2001 | Moriwaki et al. | 438/592 |
| 2004/0121541 A1 | 6/2004 | Doczy et al. | 438/259 |

(Continued)

FOREIGN PATENT DOCUMENTS

DE  102009021485 A1  11/2010  ............. H01L 27/06

OTHER PUBLICATIONS

Translation of Official Communication from German Patent Office for German Patent Application No. 10 2009 046 245.7 dated Mar. 9, 2012.

*Primary Examiner* — Shouxiang Hu
(74) *Attorney, Agent, or Firm* — Amerson Law Firm, PLLC (57) ABSTRACT

In a replacement gate approach, a superior cross-sectional shape of the gate opening may be achieved by performing a material erosion process in an intermediate state of removing the placeholder material. Consequently, the remaining portion of the placeholder material may efficiently protect the underlying sensitive materials, such as a high-k dielectric material, when performing the corner rounding process sequence.

20 Claims, 8 Drawing Sheets

(56) References Cited

U.S. PATENT DOCUMENTS

| | | | |
|---|---|---|---|
| 2005/0064663 A1 | 3/2005 | Saito | 438/275 |
| 2005/0090066 A1 | 4/2005 | Zhu et al. | 438/300 |
| 2005/0250258 A1 | 11/2005 | Metz et al. | 438/142 |
| 2007/0037343 A1 | 2/2007 | Colombo et al. | 438/231 |
| 2007/0262451 A1 | 11/2007 | Rachmady et al. | 257/758 |
| 2008/0185637 A1 | 8/2008 | Nagaoka et al. | 257/327 |
| 2009/0087974 A1 | 4/2009 | Waite et al. | 438/592 |
| 2010/0289080 A1 | 11/2010 | Wei et al. | 257/347 |

\* cited by examiner

METHOD FOR MAKING HIGH-K METAL GATE ELECTRODE STRUCTURES BY SEPARATE REMOVAL OF PLACEHOLDER MATERIALS

CROSS-REFERENCE TO RELATED APPLICATION

This is a divisional of co-pending application Ser. No. 12/894,746, filed Sep. 30, 2010, which claims priority from German Patent Application No. 10 2009 046 245.7, filed Oct. 30, 2009.

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric material of increased permittivity and a work function metal.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance by etch techniques, chemical mechanical polishing (CMP) and the like. In many cases, the polysilicon material may be removed in both types of gate electrode structures in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor.

Figure 1A:
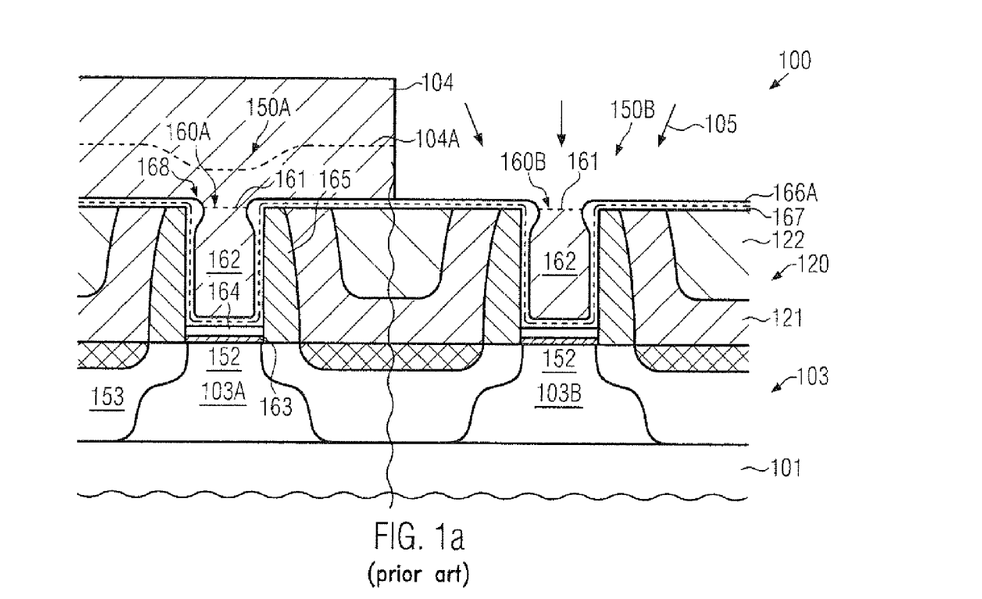
FIGS. 1a-1b schematically illustrate cross-sectional views of a sophisticated semiconductor device in which two different work function metals are applied in a late manufacturing stage according to a conventional replacement gate approach, thereby resulting in transistor non-uniformities.
Figure 1B:
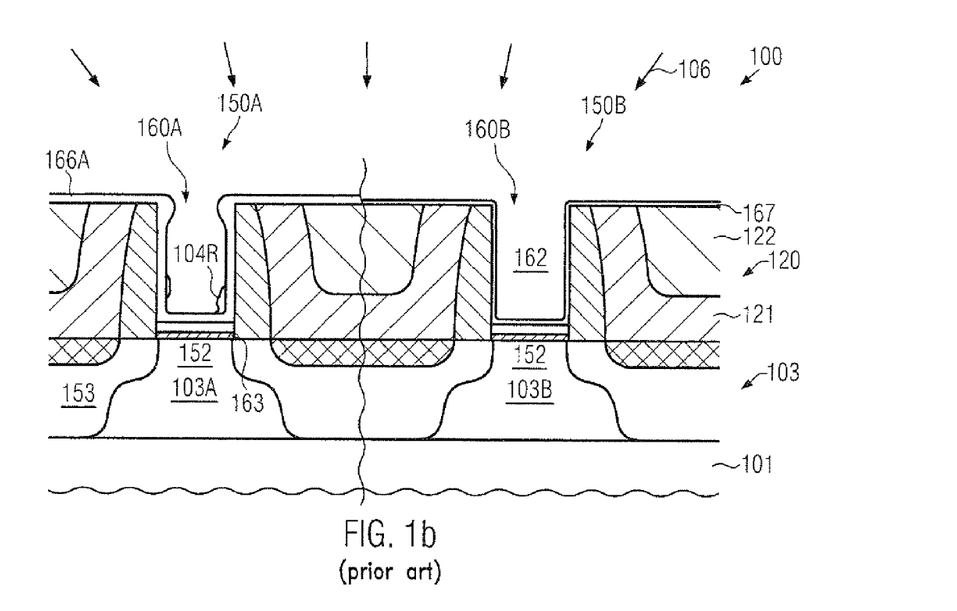

Although, in general, this approach may provide advantages in view of reducing process-related non-uniformities in the threshold voltages of the transistors since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed. With reference to FIGS. 1a-1b, a typical conventional process strategy will be described in order to illustrate in more detail any problems related to the provision of work function materials for P-channel transistors and N-channel transistors on the basis of a replacement gate approach.

FIG. 1a schematically illustrates a cross-sectional view of a sophisticated semiconductor device 100 in an advanced manufacturing stage, i.e., in a manufacturing stage in which a first transistor 150A, such as a P-channel transistor, and a second transistor 150B, such as an N-channel transistor, are formed in and above active regions 103A, 103B. The active regions 103A, 103B are laterally delineated by isolation structures (not shown) within a semiconductor layer 103, such as a silicon-based semiconductor material. The semiconductor layer 103 is formed above a substrate 101, such as a silicon bulk substrate, a silicon-on-insulator (SOI) substrate and the like. In the case of an SOI substrate, a buried insulating material (not shown) may typically be provided between a crystalline substrate material and the semiconductor layer 103. In the manufacturing stage shown, the transistors 150A, 150B comprise gate electrode structures 160A, 160B, respectively. The gate electrode structures 160A, 160B, which may also be referred to as replacement gate electrode structures, comprise a gate dielectric material 163, which typically comprises a high-k dielectric material, as previously discussed. Moreover, if required, an additional conventional dielectric material, such as a silicon oxide based material, may be provided in the dielectric material 163, for instance in order to provide superior interface conditions with respect to a channel region 152 of the transistors 150A, 150B. Furthermore, a conductive cap material, such as a titanium nitride material 164, is typically formed on the dielectric material 163 in order to confine the sensitive high-k dielectric material. Furthermore, a placeholder material 161, such as a polycrystalline silicon material, may be provided above the conductive cap layer 164 and has been removed during the previous processing so as to provide gate openings 162, which in turn comprise a material layer 166A, as required for adjusting the characteristics of one of the gate electrode structures 160A, 160B. In the example shown in FIG. 1a, it is assumed that the material layer 166A comprises a metal species that is appropriate for adjusting the work function of the gate electrode structure 160A. As previously discussed, since the material 166A has to be removed from the opening 162 of the gate electrode structure 160B in a later manufacturing stage, a barrier material or etch stop material 167 is frequently provided within the material layer 166A in order to enable the removal of the work function adjusting species from the opening 162 of the gate electrode structure 160B without unduly affecting the sensitive materials 164 and 163 in the gate electrode structure 160B. For example, tantalum nitride is frequently used for this purpose. The gate electrode structures 160A, 160B may further comprise a spacer structure 165 which has any appropriate configuration in terms of individual spacer elements, etch stop materials and the like as is required for the processes for forming the transistors 150A, 150B. For example, the spacer structures 165 may comprise silicon nitride spacer elements possibly in combination with silicon dioxide etch stop materials (not shown). Furthermore, the transistors 150A, 150B comprise drain and source regions 153 that laterally confine the channel region 152. It should be appreciated that the drain and source regions 153 in the transistor 150A may have a different configuration compared to the drain and source regions 153 of the transistor 150B due to the different conductivity type. Similarly, the channel regions 152 may differ in their basic conductivity type. Furthermore, it is to be noted that the drain and source regions 153 may have any appropriate vertical and lateral dopant profile, for instance based on corresponding counter-doped areas and the like, in order to adjust the overall transistor characteristics. In the example shown, metal silicide regions 154 may be provided in the drain and source regions 153 in order to reduce the overall series resistance and the contact resistivity of the devices 150A, 150B.

Additionally, the semiconductor device 100 comprises at least a portion of an interlayer dielectric material 120 so as to laterally enclose the gate electrode structures 160A, 160B, wherein the dielectric material 120 may be comprised of a first dielectric material 121, such as a silicon nitride material, followed by a further dielectric material 122, such as silicon dioxide, as these two materials represent well-established dielectric materials for contact structures of sophisticated semiconductor devices.

The semiconductor device 100 as illustrated in FIG. 1a may be formed on the basis of the following processes. After forming the active regions 103A, 103B by providing isolation structures and performing appropriate implantation processes based on appropriate masking regimes, the gate electrode structures 160A, 160B may be formed. For this purpose, materials for the layers 163 and 164 may be formed, for instance, by appropriate deposition techniques and/or surface treatments, followed by the deposition of the material 161, which may also be referred to as a placeholder material for the gate electrode structures 160A, 160B. Moreover, any additional materials, such as dielectric cap layers, such as silicon nitride materials, hard mask materials, for instance in the form of silicon oxynitride, amorphous carbon and the like, may additionally be deposited in order to enhance the patterning of the gate electrode structures 160A, 160B. Thereafter, sophisticated lithography and etch techniques may be applied in order to pattern the resulting material layer stack, thereby obtaining the gate electrode structures 160A, 160B comprising the material layers 163, 164 and 161. Consequently, during this patterning process, the basic geometry of the gate electrode structures 160A, 160B are defined. For example, a gate length, which is to be understood as the horizontal extension of the layers 163 and 164 in FIG. 1a, may be adjusted to a value of 50 nm and less. Thereafter, the further processing is continued by forming the drain and source regions 153 in combination with the spacer structure 165, which may serve to confine the sensitive materials 163, 164 and provide a desired offset for implantation processes in order to define the lateral configuration of the drain and source regions 153. After any anneal processes for activating the dopants in the active regions 103A, 103B and for re-crystallizing implantation-induced damage, the metal silicide regions 154 may be formed by applying well-established silicidation techniques. Thereafter, the dielectric material 121 may be deposited, followed by the material 122, which may then be planarized in order to expose a surface of the polysilicon material 161 in the gate electrode structures 160A, 160B. Next, a wet chemical etch process is applied in order to remove the material 161 selectively with respect to the dielectric material 120, the spacer structure 165 and the conductive cap layer 164. For this purpose, TMAH (tetra methyl ammonium hydroxide) has been proven as a very efficient chemical agent which may be provided at elevated temperatures, thereby efficiently removing silicon material, while at the same time providing a high degree of selectively with respect to silicon dioxide, silicon nitride, titanium nitride and the like. Upon removing the placeholder material 161, the openings 162 are formed so as to receive the material layer 166A for adjusting the work function of the gate electrode structure 160A. For this purpose, the layer 166A is deposited by any appropriate deposition technique, such as sputter deposition, chemical vapor deposition (CVD) and the like, wherein the etch stop material 167 may be provided so as to enhance the further processing of the device 100. Consequently, a certain thickness of the material layer 166A may have to be provided within the openings 162, thereby resulting in a certain degree of overhangs 168 at the upper corners of the openings 162. Furthermore, the etch stop material 167 may have an influence on the finally obtained work function of the gate electrode structures 160A, 160B since the actual work function adjusting metal of the layer 166A may be offset from materials 164 and 163 by the layer 167. Consequently, a certain degree of threshold voltage shift may be induced in the transistors 150A and/or 150B during the further processing. After the deposition of the material layer 166A, an etch mask 104 is provided so as to cover the gate electrode structure 160A and expose the gate electrode structure 160B in which the work function adjusting species of the layer 166A is to be removed selectively with respect to the etch stop layer 167. For this purpose, typically, a resist material is applied and lithographically patterned into the mask 104. During this sophisticated patterning process, the resist material may not completely fill the opening 162 and may thus result in a pronounced varying surface topography, as indicated by 104A, which may result in a less reliable patterning sequence upon exposing and developing the resist material. This deterioration mechanism may also strongly depend on the degree of overhangs 168, since, for a short gate length, the effect of the overhangs 168 may increasingly influence the fill behavior of the resist material during the lithography process. Consequently, a reliable fill and thus protection of the material layer 166A during a subsequent wet chemical etch process 105 may be less reliable in sophisticated device geometries. During the etch process 105, the work function adjusting metal, which may comprise aluminum, titanium nitride and the like for P-channel transistors, may be removed selectively with respect to the etch stop layer 167, for instance in the form of tantalum nitride, which may be accomplished by using sulfuric acid in combination with hydrogen peroxide and the like.

FIG. 1b schematically illustrates the semiconductor device 100 when exposed to a further reactive process ambient 106, in which the etch mask 104 (FIG. 1a) is removed. For example, the process 106 may represent a plasma assisted process or a wet chemical etch process. Due to the sophisticated geometry of the openings 162, in particular in the gate electrode structure 160A which may still have the overhangs 168, it may become increasingly difficult to completely remove the resist material, which may thus result in resist residues 104R. Consequently, upon further processing the device 100, the residues 104R, possibly in combination with any process non-uniformities caused during the etch process 105 (FIG. 1a), may result in a pronounced degree of variability of transistor characteristics of the transistor 150A and/or the transistor 150B. That is, process non-uniformities, in particular in the gate electrode structure 160A, may influence the further processing, i.e., the deposition of a further material layer including a work function metal for the transistor 150B and the deposition of an electrode metal, such as aluminum, thereby resulting in a significant yield loss in highly scaled semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for forming the same in which gate electrode structures may be formed on the basis of a high-k dielectric material, wherein the work function for P-channel transistors and N-channel transistors may be adjusted on the basis of a replacement gate approach. Contrary to many conventional approaches, the placeholder material may be replaced individually for these transistors, thereby avoiding some of the problems associated with the patterning of one type of work function adjusting species. For example, in some illustrative aspects disclosed herein, a conductive etch stop layer that may be conventionally applied in combination with the actual work function species may no longer be necessary, thereby significantly enhancing the overall process uniformity and thus the characteristics of the finally obtained transistor elements. For example, the corresponding shift of the work function of one or both transistor types may be avoided or at least be significantly reduced.

In one exemplary embodiment, a method is disclosed that includes, among other things, forming a gate electrode structure above a semiconductor layer of a semiconductor substrate, wherein the gate electrode structure is embedded in an interlayer dielectric material and includes a placeholder electrode material. The illustrative method further includes forming a gate opening in the gate electrode structure by selectively removing the placeholder electrode material from the gate electrode structure, and forming a material layer that includes a work function adjusting species in the gate opening and above the interlayer dielectric material. Additionally, the material layer has an overhanging portion formed adjacent to an upper corner of the gate opening and a sidewall portion formed adjacent to a sidewall of the gate opening, wherein a thickness of the overhanging portion is greater than a thickness of the sidewall portion. Moreover, the disclosed method also includes performing a material removal process to reduce the thickness of the overhanging portion by removing a first thickness portion of the overhanging portion while leaving a second thickness portion of the overhanging portion adjacent to the upper corner.

In another illustrative embodiment of the present disclosure, a method includes forming first and second gate electrode structures above a semiconductor layer of a semiconductor substrate, wherein each of the first and second gate electrode structures are embedded in an interlayer dielectric material and include a placeholder electrode material formed above a conductive cap layer. The disclosed method further includes selectively removing the placeholder electrode material from above the conductive cap layer in the first gate electrode structure so as to form a first gate opening in the first gate electrode structure while maintaining at least a portion of the placeholder electrode material above the conductive cap layer in the second gate electrode structure. Moreover, the exemplary method also includes, among other things, forming a first work function adjusting material layer in the first gate opening and above the interlayer dielectric material, the first work function adjusting material layer having an overhanging portion formed adjacent to an upper corner of the first gate opening and a sidewall portion formed adjacent to a sidewall of the first gate opening, wherein the overhanging portion has an overhang thickness adjacent to the upper corner that is greater than a sidewall thickness of the sidewall portion below the upper corner. Furthermore, the method includes performing a planarization process to remove the first work function adjusting material layer from above the interlayer dielectric material, wherein performing the planarization process includes, among other things, reducing the overhang thickness of the overhanging portion adjacent to the upper corner from a first thickness to a second thickness.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which a first work function metal may be deposited to one type of gate electrode structure while the other type of gate electrode structure may still be filled with material such as the place holder material in the form of a polysilicon material and the like. In some illustrative embodiments the remaining place holder material may be removed without requiring an additional lithography process, thereby avoiding any process irregularities that may conventionally be associated with the application of a resist material and the patterning thereof. For this purpose, the material layer including the first work function adjusting species, possibly in combination with additional etch stop materials, may be removed on the basis of a polishing process, thereby reliably preserving the work function within the first gate opening, while the place holder material may be exposed. Subsequently, the first work function metal, possibly in combination with other etch stop materials, may act as an etch stop material when removing the remaining place holder material so as to form a second gate opening. Consequently, if desired, the first work function metal may directly be formed on a conductive cap material without requiring any intermediate conductive etch stop material, such as a tantalum nitride material, and similarly the second work function metal may be formed directly on the conductive cap material in the second gate opening, thereby avoiding or at least significantly reducing any negative influence on the finally obtained work function, as may conventionally be caused by the tantalum nitride material. Moreover, any process non-uniformities caused by the lithography process for providing an etch mask for filling and covering one type of gate opening while exposing the other type of gate opening may be reduced or completely avoided.

Figure 2A:
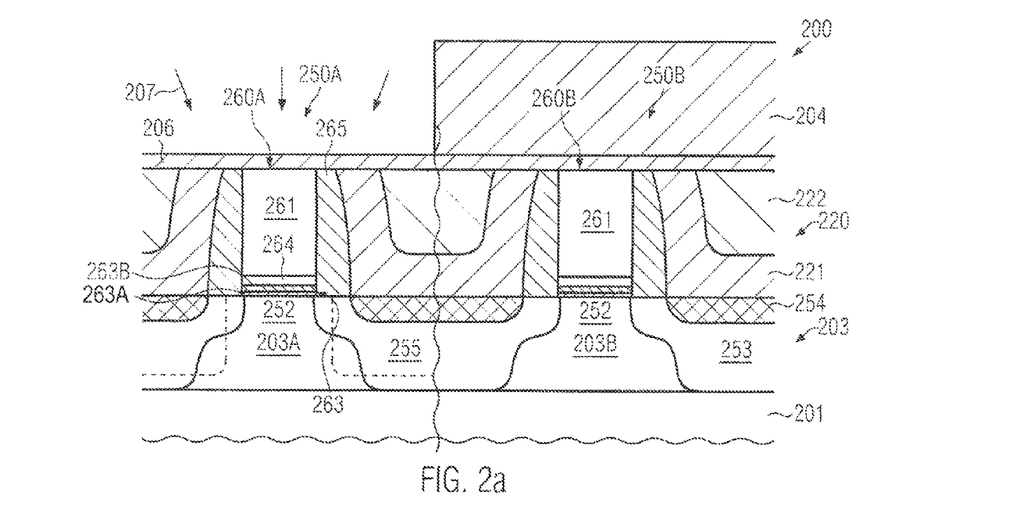
FIGS. 2a-2j schematically illustrate cross-sectional views of a semiconductor device during various manufacturing stages when forming sophisticated gate electrode structures according to a replacement gate approach in which the placeholder materials of N-channel transistors and P-channel transistors are separately removed and wherein additional lithography processes for patterning a work function metal-containing material layer are avoided, according to illustrative embodiments.
Figure 2B:
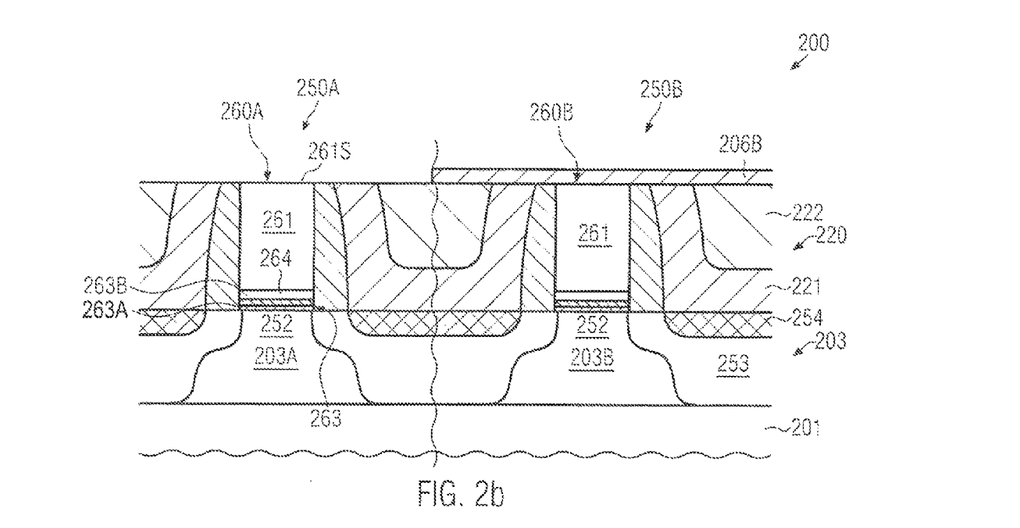
Figure 2C:
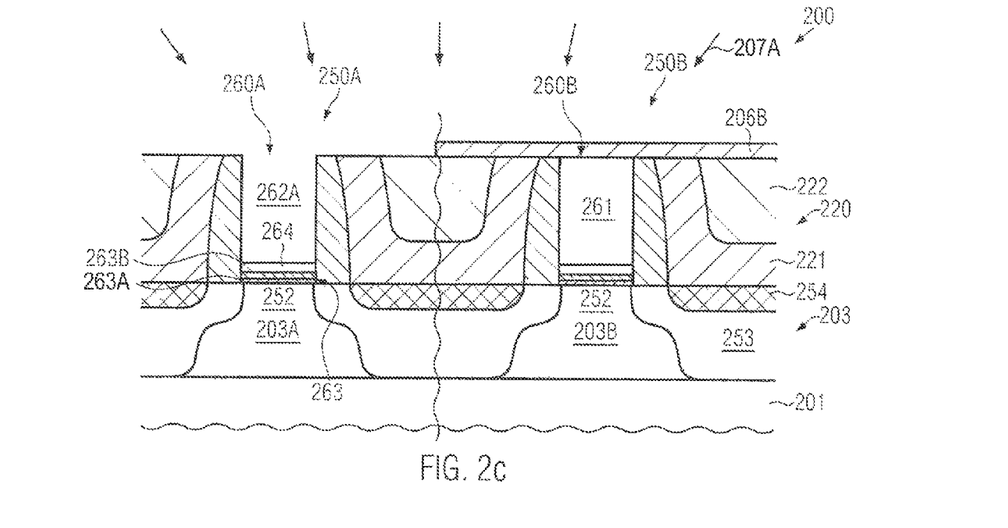
Figure 2D:
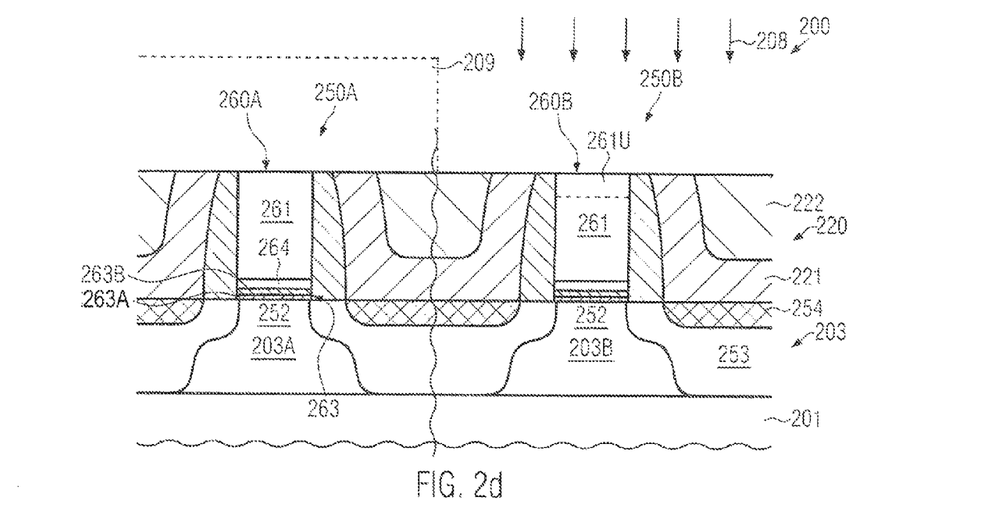
Figure 2E:
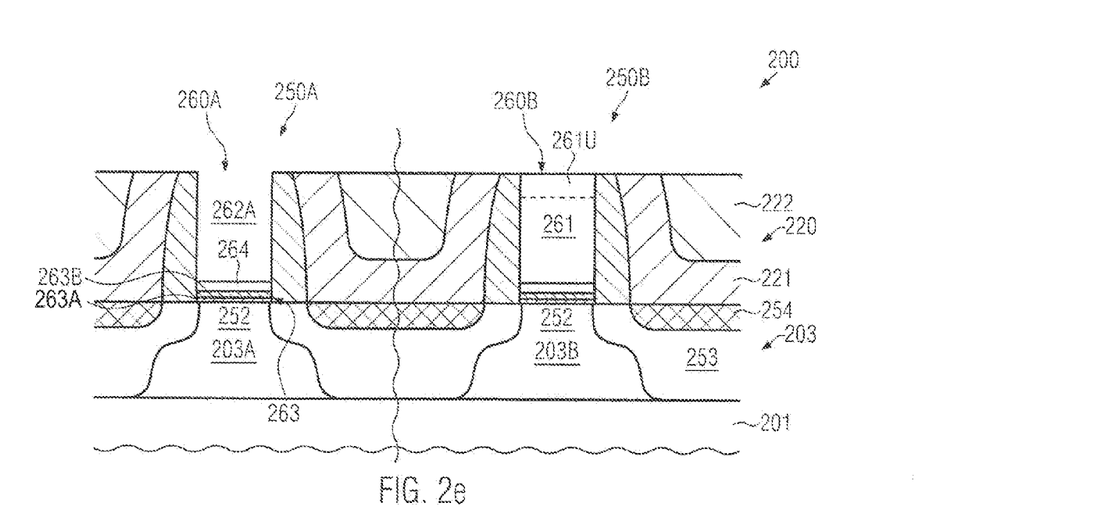
Figure 2F:
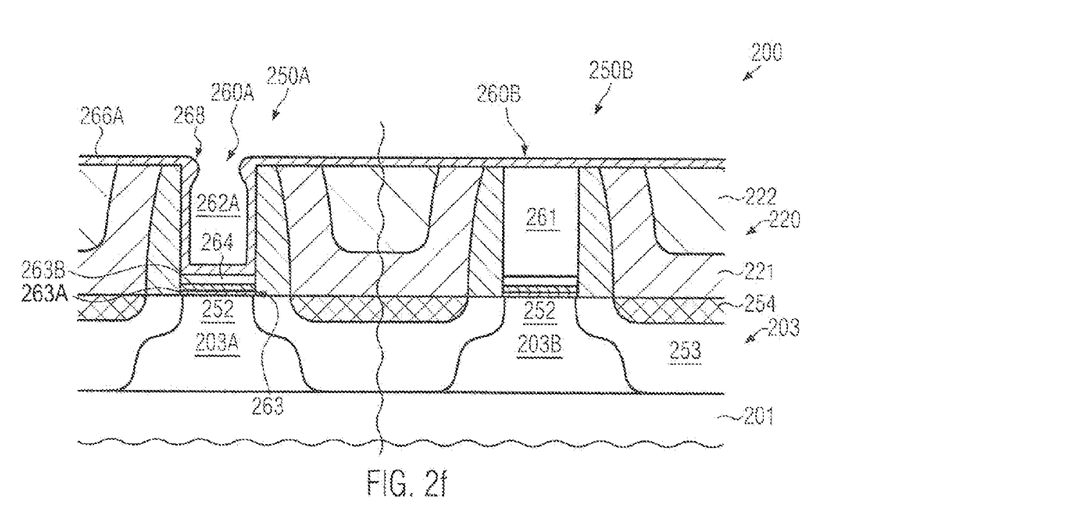
Figure 2G:
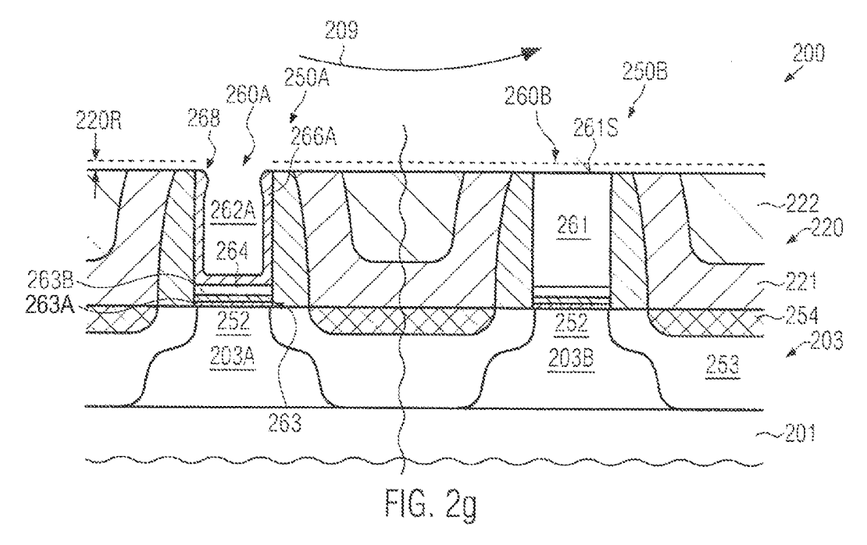
Figure 2H:
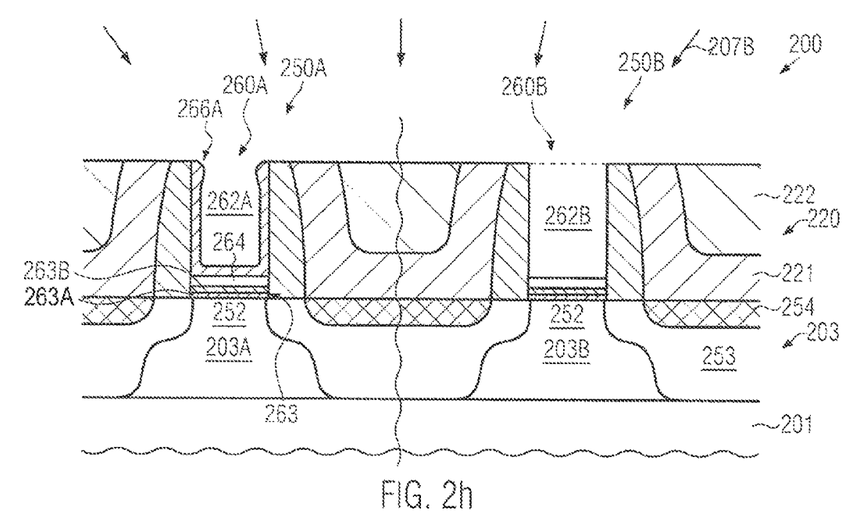
Figure 2I:
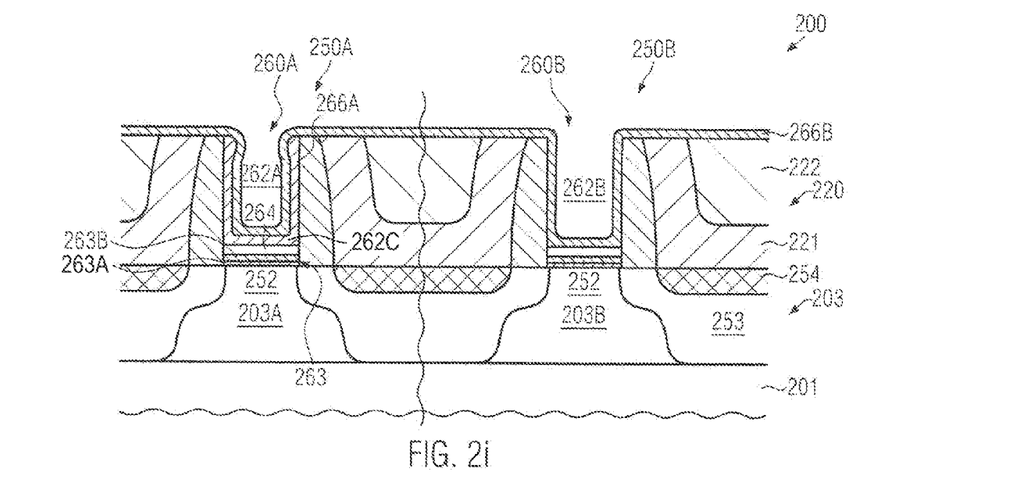
Figure 2J:
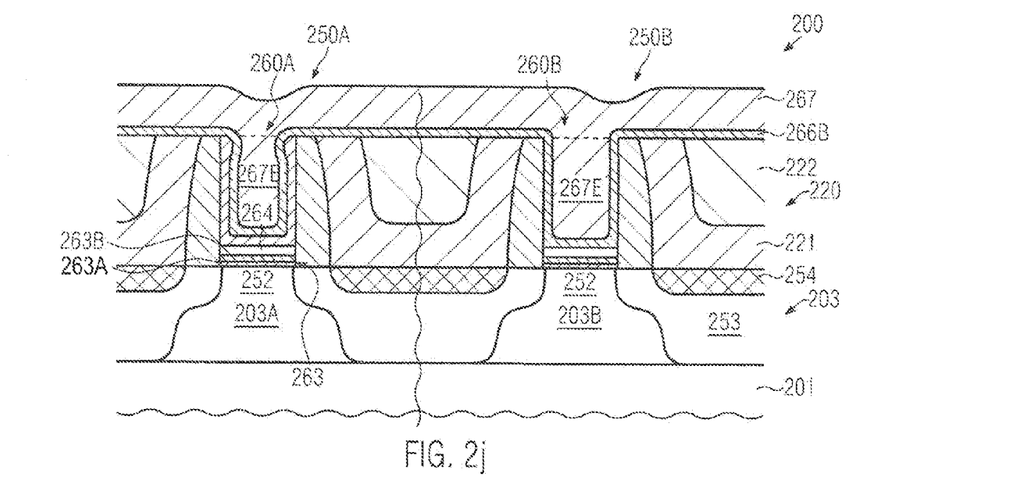
Figure 2K:
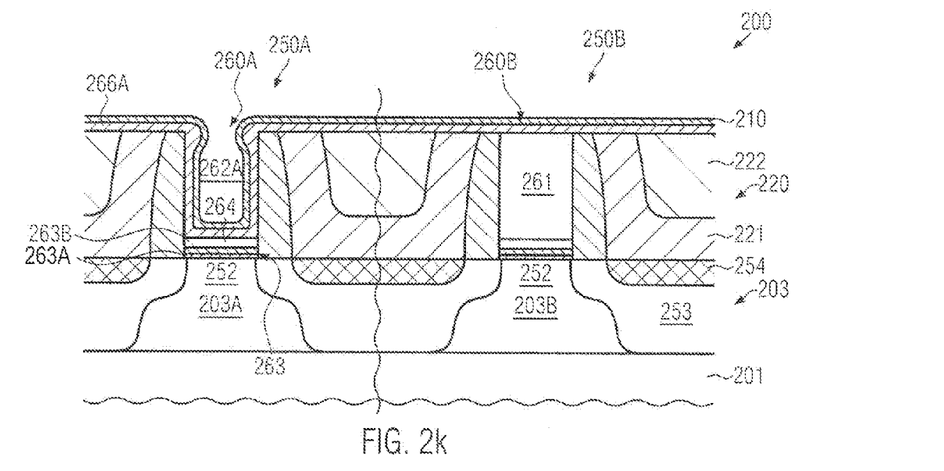
FIGS. 2k-2n schematically illustrate cross-sectional views of the semiconductor device according to still further illustrative embodiments in which a first work function metal may be removed from above a gate electrode structure which still comprises the placeholder material, thereby also improving the cross-sectional shape of the gate opening of the other transistor type.
Figure 2L:
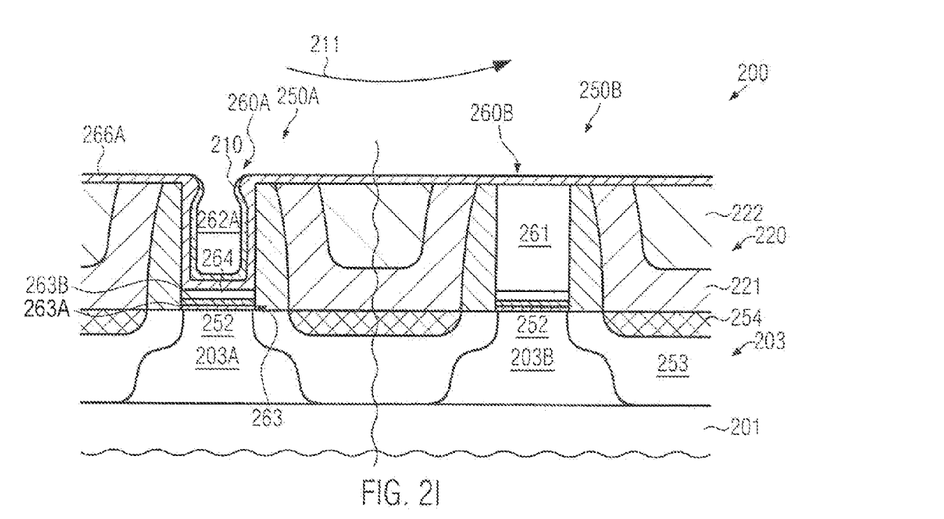
Figure 2M:
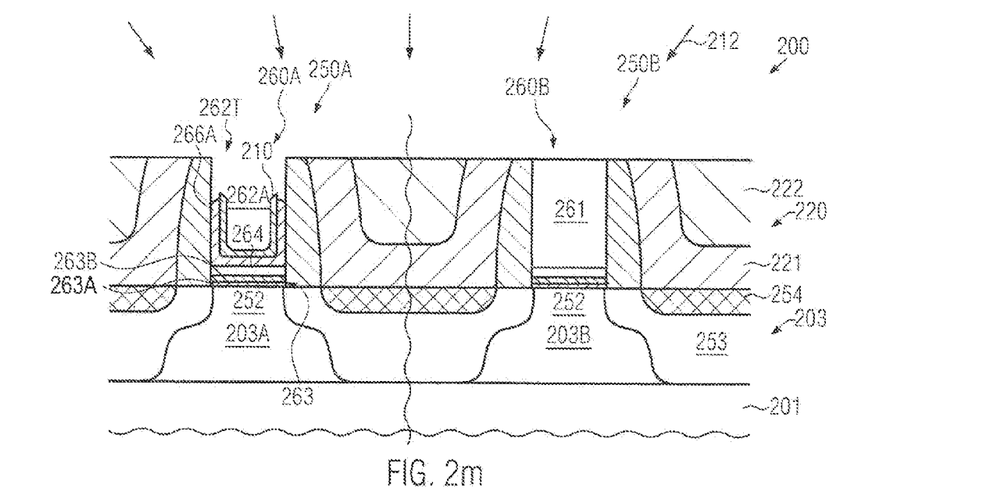
Figure 2N:
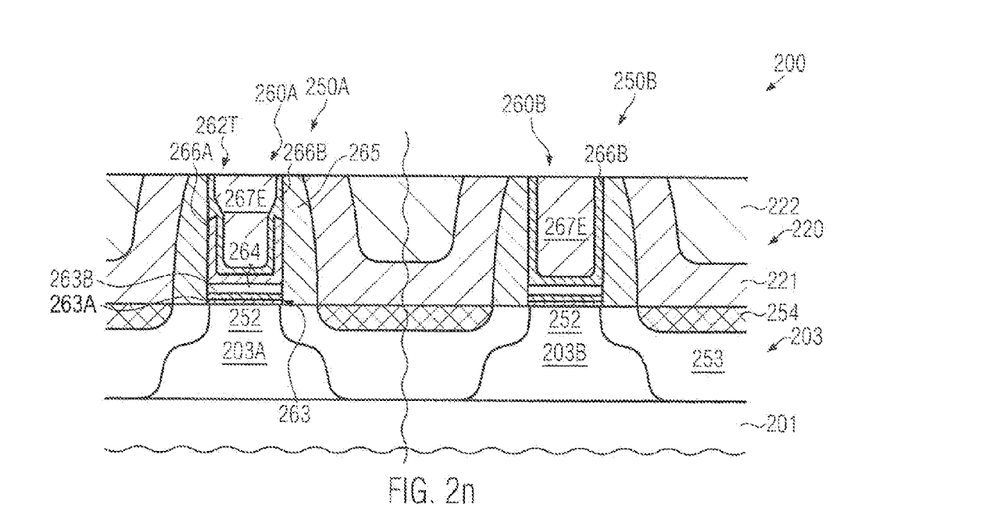

With reference to FIGS. 2a-2n further illustrative embodiments will now be described in more detail wherein also reference may be made to FIGS. 1a and 1b, if appropriate.

FIG. 2a schematically illustrates a cross-sectional view of a semiconductor device 200 comprising a first transistor 250a and a second transistor 250b which may be formed in and above corresponding active regions 203a, 203b, respectively. The active regions 203a, 203b represent portions of a semiconductor layer 203 and may laterally be delineated by isolation structures (not shown). Furthermore, the semiconductor layer 203 may be formed above an appropriate substrate 201, possibly in combination with a buried insulating material, as is also previously discussed with reference to the semiconductor device 100. The transistors 250a, 250b may represent transistors of different conductivity type, ie. a p-channel transistor and an n-channel transistor. For example, the transistor 250a may represent a p-channel transistor and may receive a corresponding work function adjusting species first, followed by the transistor 250b. It is to be appreciated that the present disclosure may also contemplate the inverse sequence, ie. a sequence in which the transistor 250a may represent an n-channel transistor while the transistor 250b may represent a p-channel transistor. In the manufacturing stage shown the transistor 250a comprises a gate electrode structure 260a and the transistor 250b may comprise a gate electrode structure 260b, which may be of similar configuration as the structure 260a. The gate electrode structures 260a, 260b may also be referred to as replacement gate structures in this stage of the overall manufacturing process. The gate electrode structures 260a, 260b may comprise a gate dielectric material 263 which, if desired, may comprise a first dielectric material 263a, such as a conventional silicon oxide-based material in combination with a high-k dielectric material 263b. Furthermore, a conductive cap material 264, such as titanium nitride and the like, may be provided on the gate dielectric material 263. Moreover, a place holder material 261, such as a polysilicon material, a silicon/germanium material and the like, may be provided above the conductive cap material 264 and may be used as an electrode material in other transistors or circuit elements, such as resistors and the like, in which a replacement of the material 261 with an electrode metal may not be desired. Furthermore, the gate electrode structures 260a, 260b may comprise a sidewall spacer structure 265. With respect to these components, also the criteria may apply as previously explained with reference to the semiconductor device 100. Furthermore, drain and source regions 253 in combination with a channel region 252 may be provided in the active regions 203a, 203b, possibly in combination with metal silicide regions 254. With respect to the conductivity type and the dopant profile in the active regions 203a, 203b the same criteria may apply as previously described with reference to the device 100. Moreover, one or both of the transistors 250a, 250b may comprise a performance enhancing mechanism, such as a strain inducing mechanism, which may be realized by an embedded strain inducing semiconductor material 255, as is illustratively depicted for the transistor 250a. For example, if representing a p-channel transistor a compressive strain inducing semiconductor alloy, such as a silicon/germanium alloy and the like, may be provided as the material 255 thereby enhancing charge carrier mobility in the adjacent channel region 252. It should be appreciated that an appropriate strain inducing mechanism may also be provided in the transistor 250b, for instance on the basis of a silicon/carbon alloy, stress memorization techniques and the like.

Furthermore, the semiconductor device 200 may comprise an interlayer dielectric material 220, for instance in the form of a first dielectric material 221 and a second dielectric material 222 having any desired composition and internal stress level when an additional strain component is to be induced by the interlayer dielectric material 220. Furthermore, a mask layer 206 may be formed above the transistors 250a, 250b and may be comprised of any appropriate material, such as silicon dioxide, silicon nitride and the like. Additionally, an etch mask 204, for instance in the form of a resist material, may be provided so as to expose a portion of the mask layer 206 above the transistor 250a while covering the layer 206 above the transistor 250b.

The semiconductor device 200 as illustrated in FIG. 2a may be formed on the basis of the following processes. The transistors 250a, 250b including the replacement gate electrode structures 260a, 260b may be formed on the basis of any appropriate process strategy, as for instance also described with reference to the semiconductor device 100. It should be appreciated that the strain inducing material 255 may be incorporated after patterning the gate electrode structures 260a, 260b by forming appropriate cavities and refilling these cavities with the material 255 on the basis of selective epitaxial growth techniques. Thereafter the further processing may be continued by forming the drain and source regions 253 in combination with the metal silicide regions 254, as discussed above. After the deposition of the interlayer dielectric material 220, in some illustrative embodiments, the material 220 may be planarized, for instance by CMP as previously discussed, thereby exposing the place holder materials 261 in the gate electrode structures 260a, 260b. In other illustrative embodiments the interlayer dielectric material 220 may be provided with sufficient excess material so as to stop the planarization process reliably above the gate electrode structures 260a, 260b so that the mask layer 206 may represent a portion of the interlayer dielectric material 220. Next, the etch mask 204 may be formed on the basis of well-established lithography techniques, which may be performed on the basis of a substantially planar surface topography. Thereafter, the device 200 may be exposed to an etch process 207 that may be performed as a wet chemical etch process, a plasma assisted etch process and the like. For this purpose a plurality of etch chemistries are available for etching a plurality of dielectric materials.

FIG. 2b schematically illustrates the semiconductor device 200 in a further advanced manufacturing stage in which the place holder material 261 of the gate electrode structure 260a may be exposed, ie. a surface 261s thereof may be exposed while a remaining portion 206b of the mask layer 206 (cf. FIG. 2a) may still cover at least the place holder material 261 of the gate electrode structure 260b. It should be appreciated that the remaining portion 206b may have a thickness of one to several nanometers, thereby not unduly affecting the overall surface topography of the semiconductor device 200.

FIG. 2c schematically illustrates the semiconductor device 200 when exposed to an etch ambient 207a for selectively removing the place holder material 261 of the gate electrode structure 260a, thereby forming a first gate opening 262a. On the other hand, the mask 206b may reliably cover at least the material 261 of the gate electrode structure 260b. The etch process 207a may be performed on the basis of any appropriate etch technique, for instance by using selective wet chemical etch recipes, plasma assisted processes and the like. In one illustrative embodiment, the process 207a may be performed as a wet chemical etch process using TMAH having a high selectivity with respect to dielectric materials and also to the conductive cap material 264.

FIG. 2d schematically illustrates the semiconductor device 200 according to further illustrative embodiments in which a mask material may be selectively formed in or above the place holder material 261 of the gate electrode structure 260b. In this manner, the overall surface topography of the device 200 may substantially not be affected by providing a mask material, thereby also contributing to superior process uniformity, if required. In the embodiment shown in FIG. 2d, an upper portion 261u of the place holder material 261 in the gate electrode structure 260b may be modified so as to exhibit an increased etch resistivity with respect to the etch process 207a (cf. FIG. 2c) so that a substantial portion of the place holder material 261 may be preserved, while the place holder material 261 in the gate electrode structure 260a may efficiently be removed, as described with reference to FIG. 2c. For this purpose, in some illustrative embodiments, the upper portion 261u may be formed at any appropriate manufacturing stage by an ion bombardment or an electron bombardment 208, which may be accomplished on the basis of an appropriate mask 209, such as a resist mask. It should be appreciated that the process 208 may be applied at any appropriate manufacturing stage, for instance prior to actually patterning the gate electrode structures 260a, 260b, that is, upon depositing the place holder material 261, the modified portion 261u may be formed on the basis of ion implantation, electron beam and the like, by using the mask 209. Similarly, at any later manufacturing stage the mask 209 may be provided so as to perform the process 208. For instance, by incorporating xenon on the basis of an ion implantation process a significant modification of the etch behaviour of the upper portion 261u compared to the material 261 may be accomplished. Thus, forming the dielectric material 220 and exposing the place holder material 261 of the gate electrode structure 260a may be accomplished with a high degree of compatibility with conventional process strategies. Moreover, the overall surface topography may substantially not be affected by providing the upper portion 261u.

FIG. 2e schematically illustrates the semiconductor device 200 in a further advanced manufacturing stage in which the mask 206b (cf. FIG. 2c) may be removed from above the gate electrode structure 260b, which may be accomplished by any appropriate wet chemical etch process, for instance on the basis of diluted hydrofluoric acid if the mask 206 is provided in the form of a silicon oxide material. It should be appreciated that during the corresponding etch process also a certain degree of material erosion of the interlayer dielectric material 220 may be induced, depending on its composition. Due to the moderately thin thickness of the mask layer a corresponding material erosion may, however, not unduly affect the overall surface topography. In other illustrative embodiments the first gate opening 262a may be formed on the basis of the upper portion 261u in the gate electrode structure 260b, thereby acting as an efficient etch stop material. It should be appreciated that a certain degree of material erosion of the upper portion 261u may occur, depending on the degree of material modification and may not negatively affect the further processing or may even be advantageous in removing the upper portion 261u upon removing the place holder material 261 of the gate electrode structure 260b in a further advanced manufacturing stage.

FIG. 2f schematically illustrates the semiconductor device 200 with a material layer 266a formed in the gate opening 262a and above the gate electrode structure 260b. The material layer 266a may comprise a work function species or metal that may be appropriate for adjusting the work function and thus the threshold voltage of the transistor 250a. For instance, the material 266a may comprise lanthanum, aluminum and the like, depending on the conductivity type of the transistor 250a. The material layer 266a may be formed without providing a conductive etch stop material, such as tantalum nitride, thereby avoiding the offsetting of the work function species from the sensitive layer stack comprising the layers 263 and 264. Furthermore, the overhangs 268 at the upper corner of the opening 262a may be less pronounced since the deposition of one or more sub layers of the layer 266a, as may typically be required in conventional approaches for providing an etch stop material, may be avoided. On the other hand, the thickness of the layer 266a may appropriately be selected so as to obtain the desired work function and the diffusion blocking characteristics in view of a second work function adjusting species that has to be deposited in a later manufacturing stage so as to adjust the work function of the gate electrode structure 260b after the removal of the place holder material 261. Moreover, the thickness of the layer 266a may be selected so as to obtain a certain minimal material erosion during the subsequent processing, for instance for removing the place holder material 261, performing cleaning processes and the like. The deposition of the layer 266a may be performed on the basis of any appropriate deposition technique, such as CVD, sputter deposition and the like.

FIG. 2g schematically illustrates the semiconductor device 200 during a material removal process 209 in which the layer 266a may be removed from the above the gate electrode structure 260b. In one illustrative embodiment the removal process 209 may comprise a CMP process for removing the material 266a from above horizontal device portions, while preserving the material 266a at least within a significant portion of the opening 262a. For this purpose, any appropriate CMP recipe may be applied wherein appropriate process parameters and slurry materials may readily be determined on the basis of experiments. Furthermore, in some illustrative embodiments, the removal process 209 may comprise a polishing process or an additional polishing phase in which a reduction of overall height of the interlayer dielectric material 220 may be accomplished, as indicated by 220r, thereby significantly reducing the degree of overhang 268, while at the same time enhancing the surface planarity of the device 200. For example, as previously discussed, a certain degree of material erosion may have occurred adjacent to the gate electrode structure 260a upon removing the mask layer 206 (cf. FIG. 2a), which may be compensated for, at least to a certain degree, by polishing the dielectric material 220. Consequently, the surface 261s of the place holder material 261 in the gate electrode structure 260b may reliably be exposed. Moreover, a certain degree of material reduction of the interlayer dielectric material 220 may also remove an upper portion of the place holder material 261, which may be advantageous when this upper portion has an increased etch resistivity with respect to a subsequent etch process, as is also discussed with reference to FIG. 2e.

FIG. 2h schematically illustrates the semiconductor device 200 when exposed to a further reactive process ambient 207b in which the place holder material 261 of the gate electrode structure 260b may be removed so as to form a second gate opening 262b. For example, the etch process 207b may be performed on the basis of TMAH, as previously described. In the etch process 207b the material layer 266a in the opening 262a may act as an etch stop material, while a degree of material erosion may be negligible or a corresponding material erosion may be taken into consideration when providing the material 266a with an appropriate initial thickness, as discussed above. In some illustrative embodiments the etch process 207b may also include a first etch step for removing a modified portion of the material 261 if a corresponding portion has been provided in an earlier manufacturing stage and if at least parts of the modified portion are still present. In this case, any appropriate etch chemistry may be applied which may not be very sensitive to a molecular modification of the place holder material 261. For this purpose, a plurality of metal hydroxides may be available. It should be appreciated that the corresponding etch step may require only a very short exposure to the corresponding etch chemistry and thereafter the further etching may be continued on the basis of TMAH and the like. It should be appreciated that prior to or after the etch process 207b any further cleaning processes may be performed if desired, for instance in view of removing residues from the preceding polishing process and the like.

FIG. 2i schematically illustrates the semiconductor device 200 in a further advanced manufacturing stage in which a further material layer 266b comprising a second work function adjusting species or metal may be formed in the gate openings 262a, 262b. The material layer 266b may thus comprise any appropriate metal species, such as lanthanum, aluminum and the like, as may be required for obtaining the desired work function of the gate electrode structure 260b. In the embodiment shown, the layer 266b may directly be formed on the conductive cap layer 264 in the opening 262b so that any undesired shift of the resulting work function and thus threshold voltage may be avoided, or at least significantly reduced. On the other hand, the material layer 266b may be formed on the layer 266a, wherein however the thickness thereof, at least at a bottom 262c of the opening 262a, may suppress any undue interaction of the material 266b with the conductive cap layer 264 and the gate dielectric material 263.

FIG. 2j schematically illustrates the semiconductor device 200 in a further advanced manufacturing stage in which an electrode material 267, for instance in the form of aluminum and the like, may be formed above the transistors 250a, 250b and in the gate electrode structures 260a, 260b. It should be appreciated that the electrode material 267 may comprise further materials, such as seed layers and barrier layers, if required. The electrode material 267 may be deposited on the basis of any appropriate deposition technique, such as CVD, sputter deposition, electrochemical deposition or any combination thereof, in accordance with overall process and device requirements. After the deposition of the electrode material 267 any excess material thereof and excess material of the layer 266b may be removed, for instance by any appropriate planarization technique, such as CMP, electro etching, electro CMP or any combination thereof. Consequently, after the removal of any excess material, electrode materials 267e, as indicated by the dashed lines, may be provided in the gate electrode structures 260a, 260b, which may thus represent electrically isolated components.

Consequently, superior device uniformity, for instance in terms of the threshold voltage of the transistors 250a, 250b may be accomplished due to a superior uniformity of the work functions of the gate electrode structures 260a, 260b, which may be accomplished by avoiding irregularities that may conventionally be induced by lithography processes for masking one of the gate openings while removing a portion of a previously deposited work function adjusting species. Moreover, in the embodiment shown, additional conductive etch stop materials, such as tantalum nitride, may not be necessary thereby even further contributing to superior uniformity of the transistor characteristics.

With reference to FIGS. 2k-2n further illustrative embodiments will now be described in which an unwanted portion of the first material layer including the first work function adjusting species may be removed on the basis of an etch process, while at the same time preserving this material in the gate opening.

FIG. 2k schematically illustrates the semiconductor device 200 in a manufacturing stage in which the material layer 266a may be formed in the gate opening 262a and above the gate electrode structure 260b, which may still comprise the place holder material 261. With respect to any characteristics of the material 266a and deposition techniques, it may be referred to the previously described embodiments. Moreover, an etch stop layer 210 may be formed on the material layer 266a, for instance in the form of a silicon dioxide material, or any other appropriate material providing for efficient etch resistivity during the subsequent processing. The layer 210 may be applied on the basis of any appropriate deposition technique, such as CVD and the like.

FIG. 2l schematically illustrates the device 200 during a material removal process 211, which may comprise a polishing process in order to remove portions of the etch stop layer 210 formed on horizontal device surface areas. Thus, during the polishing process 211 the material layer 266a may be exposed outside the gate opening 262a, in which the material 266a may still reliably be covered by the etch stop material 210. The polishing process 211 may be performed on the basis of well-established polishing recipes.

FIG. 2m schematically illustrates the semiconductor device 200 when exposed to an etch process 212, such as a wet chemical etch process, for instance based on sulphuric acid in combination with hydrogen peroxide and the like, in order to remove exposed portions of the material 266a, while the etch stop layer 210 within the opening 262a may reliably cover at least a portion of the material 266a. Consequently, during the etch process 212 the place holder material 261 of the gate electrode structure 260b may be exposed. Furthermore, upon controlling the etch time of the process 212 a desired degree of removal of the material 266a within the opening 262a may be achieved, thereby significantly enhancing the cross-sectional shape at a top area 262t of the opening 262a, which may be advantageous during the further processing for filling additional materials into the opening 262a. Thereafter, the device 200 may be exposed to an etch ambient for removing the place holder material 261, which may be accomplished by using well-established wet chemical chemistries, as discussed above. The corresponding removal process for the material 261 may be performed in the presence of the etch stop material 210 when the chemical stability of the material 266a may be critical with respect to the corresponding etch chemistry, while the stability with respect to an etch chemistry for removing the etch stop layer 210 may be superior. In other cases, the etch stop material 210 may be removed prior to etching the place holder material 261. For this purpose, any well-established wet chemical chemistries for removing materials, such as silicon dioxide, silicon nitride and the like, are available and may be used depending on the material composition of the etch stop layer 210. Thereafter, the material 261 may be removed, as previously described. Next, the further processing may be continued by depositing the second material layer including the second work function adjusting species and the electrode material wherein the superior cross-sectional shape, ie, the removal of the material 266a at the top area 262t, may enhance the deposition conditions, thereby even further increasing overall uniformity of the device 200 and providing for further enhanced scalability of the manufacturing techniques described herein.

FIG. 2n schematically illustrates the semiconductor device 200 wherein the electrode material 267e may be provided in both gate electrode structures 260a, 260b. Furthermore, the gate electrode structure 260a may comprise the material 266a, for instance in direct contact with the cap layer 264, as previously discussed, and the material 266b, which may be formed directly on the material 266a. Furthermore, due to the preceding etch process at the top area 262t, the gate electrode structure 260a may comprise the material 266b so as to directly connect to the surrounding dielectric material, such as the spacer structure 265. In the gate electrode structure 260b, the material 266b may be formed on the conductive cap layer 264, thereby also providing for superior stability of the resulting work function.

As a result, the present disclosure provides semiconductor devices and manufacturing techniques in which the place holder material of sophisticated gate electrode structures may individually be removed so as to avoid additional lithography processes for covering one gate opening while patterning a work function metal and a corresponding etch stop material in the other gate opening, as is typically required in conventional approaches. Therefore, corresponding work function metals may be provided with reduced offset to the conductive cap material and/or the gate dielectric material which may thus provide for superior stability of the work function and therefore of the resulting threshold voltage of the transistors of different conductivity type. Moreover, superior scalability of the techniques disclosed herein may be accomplished since the deposition and removal of resist materials within gate openings having lateral dimensions of 40 nm and less may be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a gate electrode structure above a semiconductor layer of a semiconductor substrate, wherein said gate electrode structure is embedded in an interlayer dielectric material and comprises a placeholder electrode material;
   forming a gate opening in said gate electrode structure by selectively removing said placeholder electrode material from said gate electrode structure;
   forming a material layer comprising a work function adjusting species in said gate opening and above said interlayer dielectric material, said material layer having an overhanging portion formed adjacent to an upper corner of said gate opening and a sidewall portion formed adjacent to a sidewall of said gate opening, wherein a thickness of said overhanging portion is greater than a thickness of said sidewall portion; and
   performing a material removal process to reduce said thickness of said overhanging portion by removing a first thickness portion of said overhanging portion while leaving a second thickness portion of said overhanging portion adjacent to said upper corner.

2. The method of claim 1, wherein, after performing said material removal process, forming a conductive electrode material above said material layer so as to fill said gate opening.

3. The method of claim 1, wherein performing said material removal process comprises removing said material layer from above said interlayer dielectric material.

4. The method of claim 3, wherein performing said material removal process comprises performing a chemical mechanical polishing process.

5. The method of claim 4, wherein performing said chemical mechanical polishing process comprises reducing an overall height of said interlayer dielectric material.

6. The method of claim 1, further comprising, after performing said material removal process, forming a second material layer comprising a second work function adjusting species on said material layer in said gate opening and above said interlayer dielectric material.

7. The method of claim 6, further comprising, after forming said material layer, forming a second gate opening in a second gate electrode structure by selectively removing a second placeholder electrode material from said second gate electrode structure and forming said second material layer in said gate opening and in said second gate opening during a common deposition process.

8. The method of claim 1, wherein forming said gate electrode structure comprises forming a gate dielectric layer comprising a high-k dielectric material above said semiconductor layer, forming a conductive cap layer above said gate dielectric layer, and forming said placeholder electrode material above said conductive cap layer.

9. The method of claim 8, wherein selectively removing said placeholder electrode material comprises removing said placeholder electrode material from above said conductive cap layer, and wherein forming said material layer in said gate opening comprises forming said material layer on said conductive cap layer.

10. The method of claim 1, wherein a thickness of said second thickness portion of said overhanging portion is greater than said thickness of said sidewall portion.

11. A method, comprising:
forming first and second gate electrode structures above a semiconductor layer of a semiconductor substrate, wherein each of said first and second gate electrode structures are embedded in an interlayer dielectric material and comprise a placeholder electrode material formed above a conductive cap layer;
selectively removing said placeholder electrode material from above said conductive cap layer in said first gate electrode structure so as to form a first gate opening in said first gate electrode structure while maintaining at least a portion of said placeholder electrode material above said conductive cap layer in said second gate electrode structure;
forming a first work function adjusting material layer in said first gate opening and above said interlayer dielectric material, said first work function adjusting material layer having an overhanging portion formed adjacent to an upper corner of said first gate opening and a sidewall portion formed adjacent to a sidewall of said first gate opening, said overhanging portion having an overhang thickness adjacent to said upper corner that is greater than a sidewall thickness of said sidewall portion below said upper corner; and
performing a planarization process to remove said first work function adjusting material layer from above said interlayer dielectric material, wherein performing said planarization process comprises reducing said overhang thickness of said overhanging portion adjacent to said upper corner from a first thickness to a second thickness.

12. The method of claim 11, wherein said second thickness is greater than said sidewall thickness.

13. The method of claim 11, wherein maintaining at least said portion of said placeholder electrode material above said conductive cap layer in said second gate electrode structure comprises forming a mask layer to cover said second gate electrode structure and to expose said first gate electrode structure.

14. The method of claim 11, wherein maintaining at least said portion of said placeholder electrode material in said second gate electrode structure comprises selectively modifying an etch resistivity of said placeholder electrode material in said second gate electrode structure.

15. The method of claim 11, further comprising, after performing said planarization process, forming a second gate opening in said second gate electrode structure by selectively removing said placeholder electrode material from above said conductive cap layer in said second gate electrode structure.

16. The method of claim 15, further comprising forming a second work function adjusting material layer in said second gate opening and on said first work function adjusting material layer in said first gate opening.

17. The method of claim 16, wherein a work function adjusting species comprising said second work function adjusting material layer is different than a work function adjusting species comprising said first work function adjusting material layer.

18. The method of claim 15, wherein said first work function adjusting material layer is formed on said conductive cap layer in said first gate electrode structure and said second work function adjusting material layer is formed on said conductive cap layer in said second gate electrode structure.

19. The method of claim 11, wherein said conductive cap layer in each of said first and second gate electrode structures is formed above a gate dielectric layer comprising a high-k dielectric material.

20. The method of claim 11, wherein performing said planarization process comprises reducing an overall height of said interlayer dielectric material.

* * * * *